(12) United States Patent
Krivokapic

(10) Patent No.: US 6,448,161 B1
(45) Date of Patent: Sep. 10, 2002

(54) SILICON BASED VERTICAL TUNNELING MEMORY CELL

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/590,877

(22) Filed: Jun. 9, 2000

(51) Int. Cl.[7] .................. H01L 21/22; H01L 21/8234
(52) U.S. Cl. .................. 438/547; 438/200; 438/237; 438/979
(58) Field of Search ................ 438/201, 211, 438/212, 210, 217, 231, 232, 238, 258, 291, 382, 519, 527, 595, 655, 657, 778, 45, 547, 237, 517, 979

(56) References Cited

U.S. PATENT DOCUMENTS

| | | | |
|---|---|---|---|
| 5,032,891 A | * 7/1991 | Takagi et al. | 357/41 |
| 5,093,699 A | * 3/1992 | Weichold et al. | 357/22 |
| 5,390,145 A | 2/1995 | Nakashito et al. | |
| 5,606,177 A | * 2/1997 | Wallace et al. | 257/25 |
| 5,698,997 A | 12/1997 | Williamson, III et al. | |
| 5,869,845 A | * 2/1999 | Vander Wagt et al. | 257/25 |
| 5,936,265 A | * 8/1999 | Koga | 257/105 |
| 5,953,249 A | 9/1999 | van der Wagt | |
| 6,184,539 B1 | * 2/2001 | Wu et al. | 257/25 |

OTHER PUBLICATIONS

"Design and Analysis of Resonant–Tunneling–Diode (RTD) Based High Performance Memory System", T. Uemura and P. Mazumder, vol. E82–C, No. 9, Sep. 1999.

* cited by examiner

Primary Examiner—Carl Whitehead, Jr.
Assistant Examiner—Pamela E Perkins
(74) Attorney, Agent, or Firm—Amin & Turocy, LLP

(57) ABSTRACT

A method of forming a memory device from a single transistor and a single RTD structure is provided. The method comprises the steps of forming a silicon base, an oxide layer over the base and a top thin silicon layer over the oxide layer. The top silicon layer has a first region and a second region. The second region is masked and a transistor device is formed in the first region of the top silicon layer. Next, the first region is masked and a vertical RTD device is formed in the second region. The step of forming a vertical RTD device in the second region comprises implanting a $n^+$ dopant to form concurrently a source and drain region of the transistor device and a generally horizontal $N^+$ quantum well region of the vertical RTD device. The drain region of the transistor device is coupled to the quantum well region of the vertical RTD. The $N^+$ quantum well region is disposed horizontally below a top surface of the second region.

24 Claims, 9 Drawing Sheets

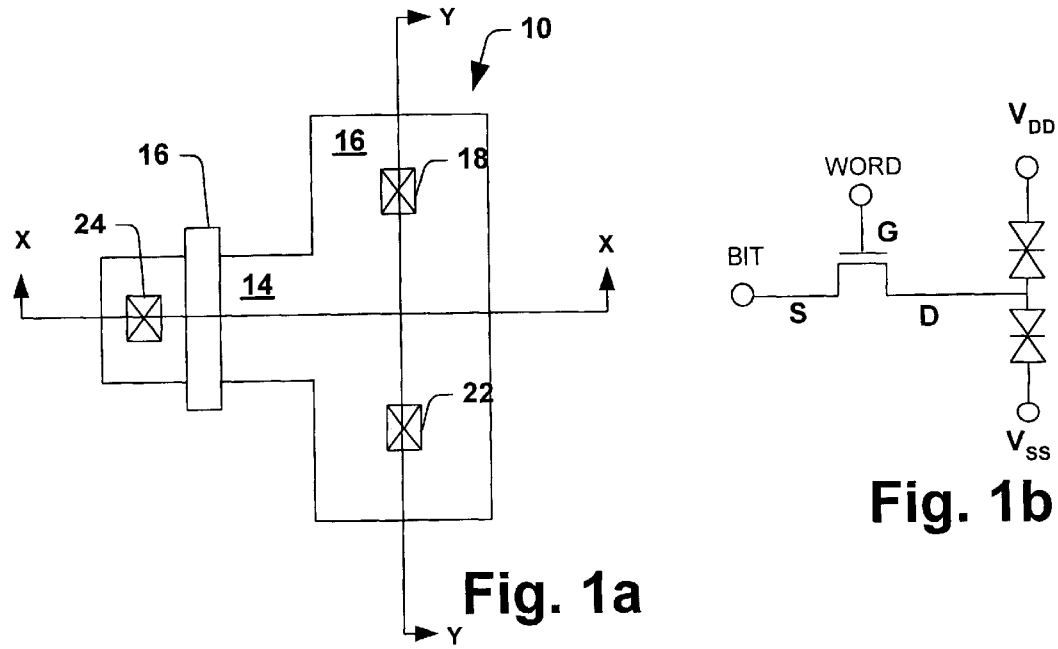
Fig. 1a
Fig. 1b
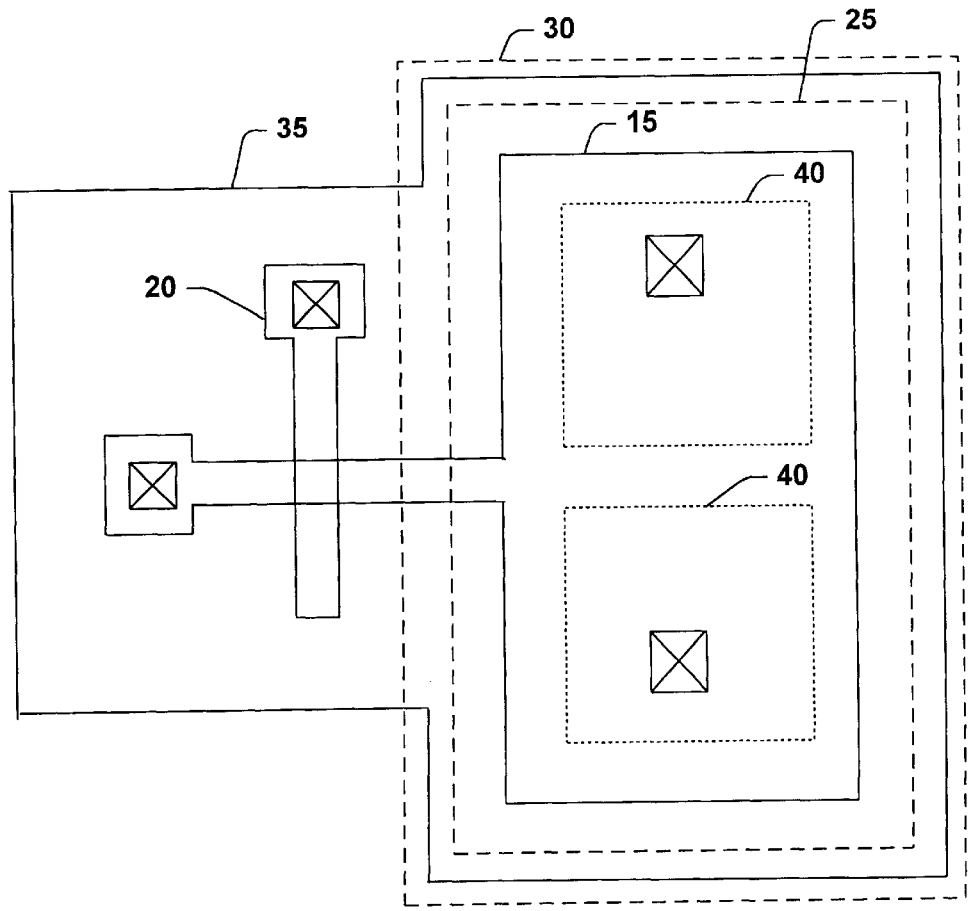
Fig. 1c

SILICON BASED VERTICAL TUNNELING MEMORY CELL

FIELD OF THE INVENTION

The present invention generally relates to the design of memory cells and, more particularly, to a memory cell consisting of a metal oxide silicon (MOS) transistor structure and a resonant tunneling diode (RTD) device.

BACKGROUND OF THE INVENTION

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. High density random access memory (RAM) devices have reached the gigabyte level with the introduction of the dynamic RAM (DRAM). The DRAM memory cell can consist of a single pass transistor and a capacitor to obtain the smallest possible cell size. However, DRAM devices require periodic refreshing, typically in the order of once per millisecond, since a bit stored as a charge on a capacitor leaks away at a fairly fast rate. Static RAM (SRAM) devices provide enhanced functionality since no refreshing is need and are also generally faster than a DRAM device. However in general the SRAM device is more complex, requiring either six transistors or four transistors and two load resistors. It is therefore desirable to have memory cells with functional qualities of SRAM devices but with cell sizes closer to the DRAM devices.

A memory cell using a negative differential resistance elements has drawn much attention as a memory structure able to form an SRAM with a more simplified structure. If a load is connected to a differential resistance element, three stable operating points can be obtained. An SRAM cell can be formed by employing two of the three stable operating points. A resonant tunneling diode (RTD) latch typically consists of a sequence of five semiconductor layers. The outer two layers are contact layers and the inner three layers include two narrow tunneling barrier layers and a middle wide layer referred to as a quantum well. Each layer differs in their respective energy bandwidths necessary to tunnel through the RTD and provide current flow. The sequence of layers produces an energy profile through which electrons travel and can include two energy barriers (e.g., the tunneling barriers) separate by a narrow region (e.g., the quantum well). Typically, an electron with energy referred to as the Fermi energy, approaching the first tunneling barrier is reflected. However, as the dimensions of the tunneling barrier decrease toward the wavelength of the electron, the electron begins tunneling through the barrier causing current to flow. Since RTD structures have positive qualities such as high speed, high noise immunity, low power and can be fabricated at high densities, the structure becomes ideally suited for memory devices. However, improvements in fabrication and size are always highly desirable.

In view of the above, it is apparent that there is a need in the art for a method of providing an SRAM memory device that is smaller and consumes less power than conventional SRAM memory devices. It is also apparent that improved methods of fabricating such devices are also needed.

SUMMARY OF THE INVENTION

The present invention provides for a method of forming an SRAM memory device from a single transistor and a single RTD structure. One aspect of the invention relates to a method of forming a memory device. The method comprises the steps of forming a silicon base, an oxide layer over the base and a top thin silicon layer over the oxide layer. The top silicon layer has a first region and a second region. The second region is masked and a transistor device is formed in the first region of the top silicon layer. Next, the first region is masked and a vertical RTD device is formed in the second region. The step of forming a vertical RTD device in the second region comprises implanting a $n^+$ dopant to form concurrently a source and drain region of the transistor device and a generally horizontal $N^+$ quantum well region of the vertical RTD device. The drain region of the transistor device is coupled to the quantum well region of the vertical RTD. The $N^+$ quantum well region is disposed horizontally below a top surface of the second region.

Another aspect of the invention relates to a method of forming a memory device. The method comprises the steps of forming a silicon base, an oxide layer over the base and a top silicon layer over the oxide layer. The top silicon layer has a first region and a second region. The second region is masked and a gate and a $P^-$ body region is formed in the first region. A nitride layer is then formed over the top silicon layer. A spacer pair is formed adjacent opposite sides of the gate by etching away the nitride layer. $N^+$ source and $N^+$ drain regions are formed in the first region and a $N^+$ quantum well region in the second region of the top silicon layer. The drain region of the transistor device is coupled to the quantum well region of the vertical RTD. The $N^+$ quantum well region is disposed horizontally below a top surface of the second region. A first insulating layer is deposited over the top surface of the silicon layer. The first insulating layer is then removed from the first region forming a resistor protection mask over the second region. A first silicide is deposited over the gate and the $N^+$ source and $N^+$ drain regions.

A second insulating layer is then deposited over the top surface of the silicon layer. A second nitride layer is deposited over the second insulating layer. A first opening is formed above the $N^+$ quantum well region on a first end of the $N^+$ quantum well region and a second opening is formed above the $N^+$ quantum well region on a second end of the $N^+$ quantum well region. A first thin layer of undoped silicon is then deposited in the first opening to form a first tunneling barrier and a second thin layer of undoped silicon is deposited in the second opening to form a second tunneling barrier. An in-situ $P^+$ amorphous layer is deposited over the first and second regions and the RTD structure is polished to remove a predetermined thickness of the amorphous layer equivalent to the thickness of the amorphous layer overlying the nitride layer to form a first contact region over the layer of undoped silicon in the first opening and a second contact region over the layer of undoped silicon in the second opening. A second silicide is then deposited over the first contact region and the second contact region.

In yet another aspect of the invention a memory device is provided. The memory device comprises a silicon substrate, an insulating oxide layer formed over the substrate and a top silicon layer formed over the insulating oxide layer. The top silicon layer has a transistor region and a RTD structure region. A gate is formed over a region of the transistor region and a gate oxide is formed between the gate and the transistor region. An $N^+$ source region is formed in the transistor region and a common $N^+$ drain region formed in the transistor region and $N^+$ quantum well region formed in the RTD structure region. A first silicide is formed over the gate and the $N^+$ source and the $N^+$ drain regions. A first opening is formed above the N⁺ quantum well region on a first end of the N⁺ quantum well region and a second opening formed above the N⁺ quantum well region on a second end of the N⁺ quantum well region. A first thin layer of undoped silicon is formed in the first opening to form a first tunneling barrier and a second thin layer of undoped silicon is formed in the second opening to form a second tunneling barrier. An in-situ P⁺ amorphous material is formed over the first and second openings to form a first contact region over the layer of undoped silicon in the first opening and a second contact region over the layer of undoped silicon in the second opening. A second silicide is formed over the first contact region and the second contact region.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1a illustrates a top view of a memory structure in accordance with the present invention;

FIG. 1b illustrates a schematic diagram of an equivalent circuit of the memory device of FIG. 1a in accordance with the present invention;

FIG. 1c illustrates a top view of the memory structure and various masks employed during fabrications of the memory structure of FIG. 1a in accordance with the present invention;

DETAILED DESCRIPTION OF THE INVENTION

Figure 2:
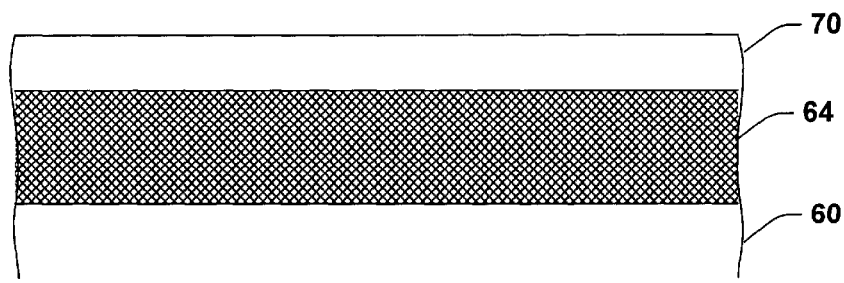
FIG. 2 is a schematic cross-sectional illustration of an SOI substrate in accordance with the present invention.
Figure 3:
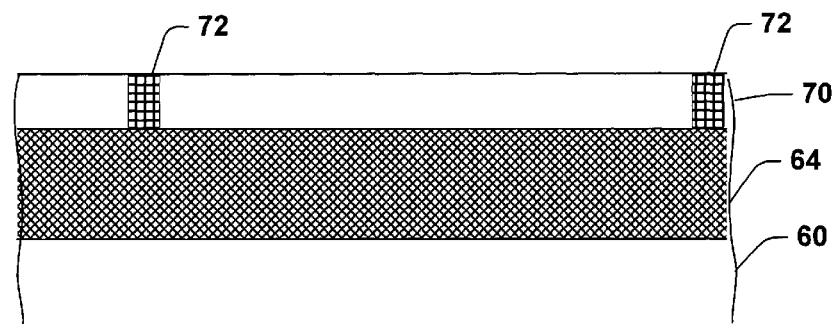
FIG. 3 is a schematic cross-sectional illustration of the structure of FIG. 2 with isolation regions formed therein in accordance with the present invention.

The present invention relates to an SRAM memory device structure which utilizes a single transistor and a resonant tunneling diode (RTD) structures to form a memory cell. The memory device of the present invention exhibits faster performance, lower power consumption and is much smaller than many conventional memory devices. The present invention will now be described with reference to the drawings, wherein like reference numerals are used to refer to like elements throughout. Although the present invention is described primarily in connection with an SOI MOSFET device structure, the present invention may be employed in connection with bulk MOSFET device structures as well. It should be understood that the description of this preferred embodiment is merely illustrative and that it should not be taken in a limiting sense.

FIG. 1a is a memory device structure 10 including a transistor region 14 and an RTD region 16. A bit contact 24 is provided in the transistor region 14 for coupling a transistor source region to a bit line and a word line 17 is connected to a transistor gate of the same transistor device. A power bit 18 is provided for connecting one end of an RTD structure in the RTD region 16 to $V_{DD}$ and a supply bit 22 is provided for connecting the other end of the RTD structure to $V_{SS}$. The transistor is coupled to the RTD by a commonly shared doped region (not shown). An equivalent circuit of the memory device structure 10 is illustrated in FIG. 1b. The source of the transistor is coupled to the bit contact 24, the gate is coupled to the word line 17 and the drain is coupled to a quantum well region of the RTD. FIG. 1c illustrates the various masks utilized in the fabrication of memory device structure 10. The masks include an activation or isolation mask 15, a gate mask 20, an n-channel halo mask or Vt adjust mask 25, a resistor protect mask 30, a N$^+$ source/drain mask 35 and a P$^+$ RTD mask 40.

Turning now to FIGS. 2–12, fabrication steps in connection with forming the transistor structure in the transistor region 14 of FIG. 1a are discussed. FIG. 2–12 illustrate a X—X cross section of FIG. 1a. FIG. 2 illustrates a basic SOI structure in its early stages of fabrication. The structure includes the silicon base 60, the silicon oxide layer 64 and the top silicon layer 70. This basic structure is formed preferably via a SIMOX (Separation by Implantation of Oxygen) process. The basic steps of the SIMOX process involve implanting oxygen beneath the surface of a silicon wafer. An annealing step is next performed to coalesce the implanted oxygen atoms into a uniform layer of $SiO_2$. Sometimes, epitaxial silicon may be grown atop the silicon to satisfy specific device requirements, but with or without an epitaxial layer, the top surface film 70 becomes the active region for device fabrication. The buried oxide layer 64 is typically about 2000 Å thick and exhibit almost complete incorporation of the implanted oxygen. Typical implant energies range from 150 to 200 keV, while the oxygen dose may vary from 1 to 2E18 cm$^2$. The top silicon film 70 thickness as well as the variation thereof with respect to the oxide layer 64 thickness is a function of the implant energy as well as the rate of surface silicon sputtering during the implant process. Preferably, the top silicon film 70 has a thickness range of 800 to 1200 Å thick.

A second step in the SIMOX process is high temperature annealing. Such annealing is typically performed at temperatures greater than 1250° C. for several hours to coalesce the implanted oxygen and achieve solid state recrystallization of the top (superficial) silicon layer 70 from the surface downward.

Figure 4:
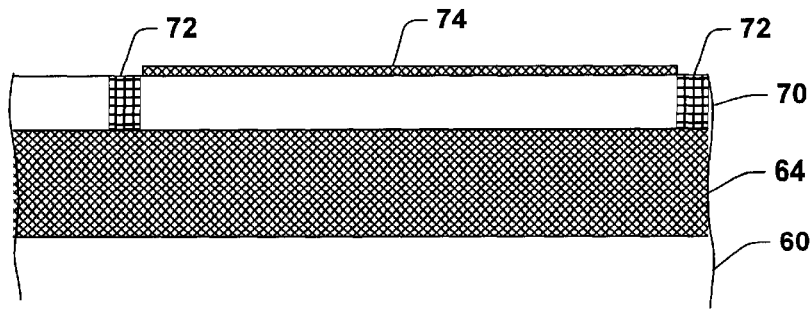
FIG. 4 is a schematic cross-sectional illustration of the SOI substrate of FIG. 3 with a pad oxide layer formed thereon in accordance with the present invention.

Shallow isolation trenches 72 are formed (FIG. 3) by using the active mask 15. FIG. 4 illustrates the laying of a thin gate oxide material 74 being laid down on the top silicon layer 70 between the shallow trenches 72. The thin gate oxide material 74 is formed to have a thickness within the range of about 10–20 Å. Preferably, the thin gate oxide material 74 includes $SiO_2$ which has a substantially low dielectric constant. However, it is to be appreciated that any suitable material (e.g., $Si_3N_4$) for carrying out the present invention may be employed and is intended to fall within the scope of the present invention.

Figure 5:
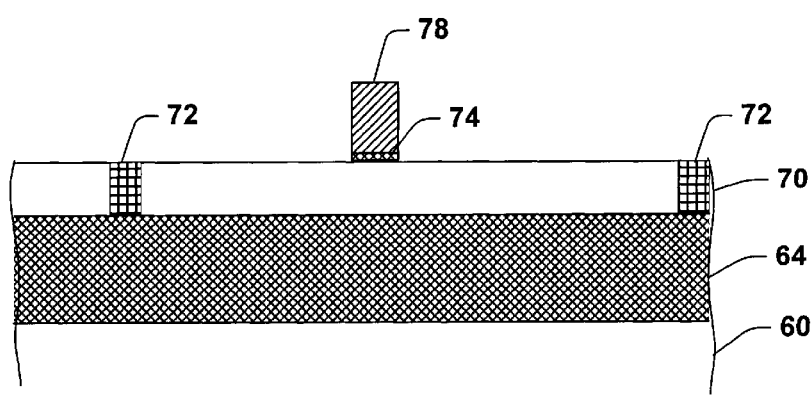
FIG. 5 is a schematic cross-sectional illustration of the SOI substrate of FIG. 4 having a gate structure formed thereon in accordance with the present invention.
Figure 6:
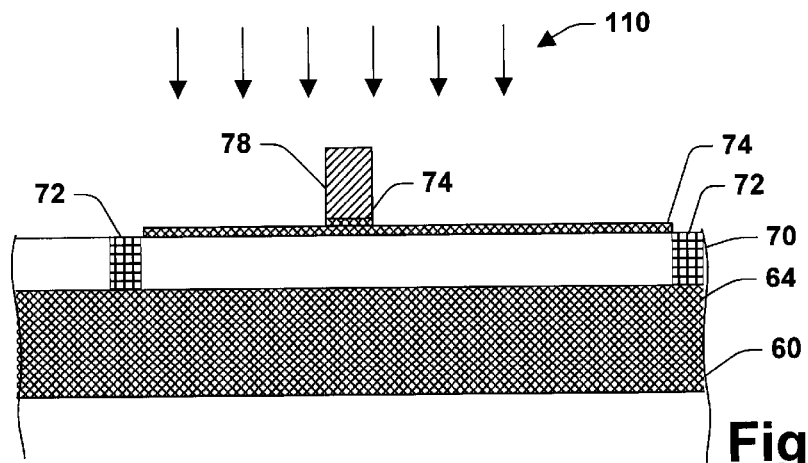
FIG. 6 is a schematic cross-sectional illustration of the structure of FIG. 4 including a polysilicon layer thereon in accordance with the present invention.
Figure 7:
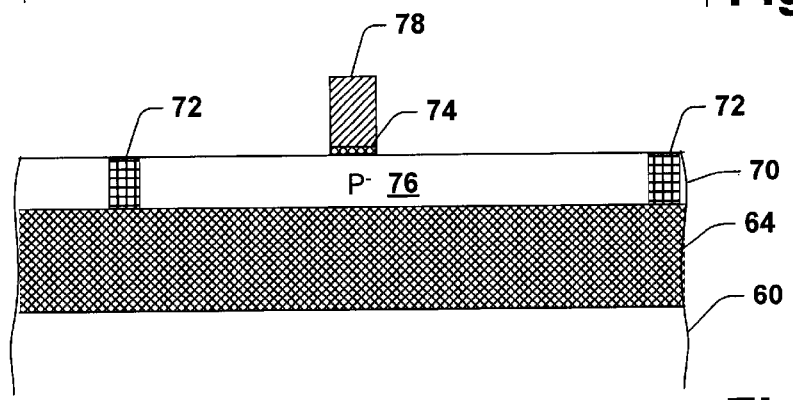
FIG. 7 is a schematic cross-sectional illustration of the structure of FIG. 6 after the polysilicon layer is etched away to form a gate in accordance with the present invention.

The top silicon layer 70 is of a p-type and the trenches 72 serve as isolation barriers to define active regions. A gate structure 78 is produced on the top silicon layer 70 (FIG. 5). FIG. 6 shows the formation of the p-type body 76 by masking a region of the top silicon layer 70 with the n-channel halo mask 25 and implanting p$^+$ dopants 110 (FIG. 6) to provide the p-type body 76 (FIG. 7). The n-channel halo mask or $V_t$ adjust mask 25 is utilized to ensure that none of the channel dopant enters the RTD area. The n-channel halo mask 25 overlaps the RTD area a sufficient distance to avoid any channel dopant from entering the RTD area. In the preferred embodiment, this implant step 110 may be a boron implant having a dose of $1 \times 10^{13}$ to $2 \times 10^{13}$ atoms/cm$^2$ and an energy range of about 3 KeV to about 5 KeV.

As shown in FIG. 7 the gate 78 is formed between the shallow trenches 72 over the thin gate oxide material 74. The gate 78 is formed by depositing a layer of polysilicon 80–120 nm thick and etching portions of the polysilicon layer using the gate mask 20. Preferably, the gate material is doped prior to the formation of the gate 78. The gate 78 has a channel length within the range of about 50–150 nm. It will be appreciated of course that the thickness of the thin gate oxide material 74 and the gate 78 may be tailored as desired and the present invention intends to include any suitable range of thicknesses thereof for carrying out the present invention. Excess gate oxide material 74 is removed as is conventional.

An alternate N$^-$ implant step can be performed for forming n-channel transistor lightly doped regions which are self-aligned with the gate 78. In the preferred embodiment, this implant step may be an arsenic implant for example having a dose in the range of $1 \times 10^{14}$ to $2 \times 10^{14}$ atoms/cm$^2$ and an energy range of about 2 KeV to about 3 KeV or a phosphorous implant for example having a dose in the range of $1 \times 10^{14}$ to $2 \times 10^{14}$ atoms/cm$^2$ and an energy range of about 5 KeV to about 7 KeV. Arsenic is employed to make a substantially shallow junction because of its heavy nature and less tendency to move. Of course it will be appreciated that any suitable dose and energy range and implant may be employed to carry out the present invention.

Figure 8:
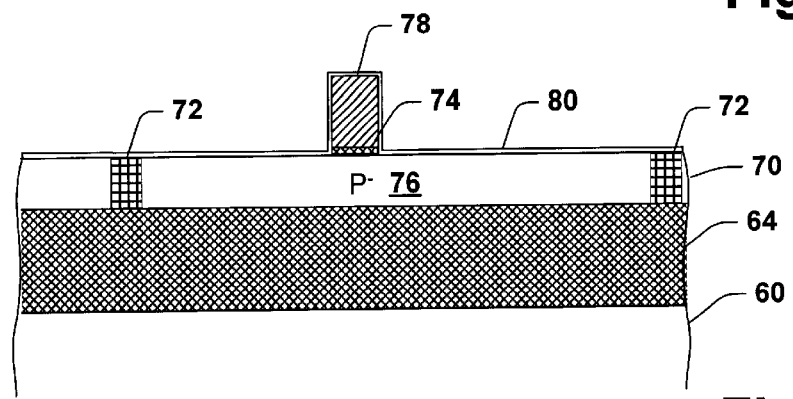
FIG. 8 is a schematic cross-sectional illustration of the structure of FIG. 7 after an oxide liner is deposited over the structure in accordance with the present invention.
Figure 9:
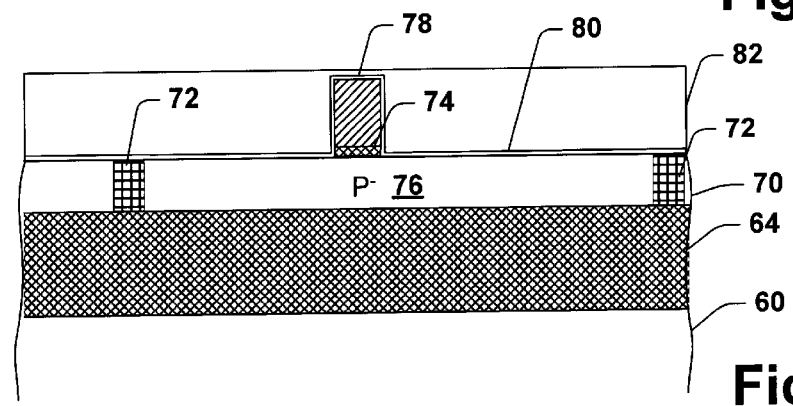
FIG. 9 is a schematic cross-sectional illustration of the structure of FIG. 8 after a nitride layer is deposited over the oxide liner in accordance with the present invention.
Figure 10:
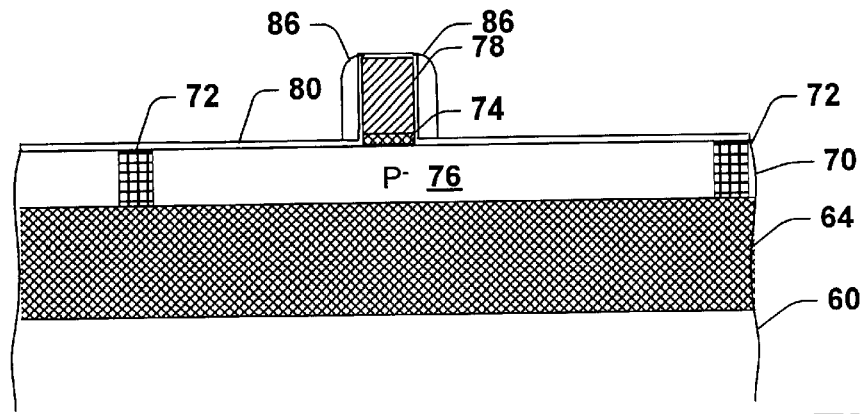
FIG. 10 is a schematic cross-sectional illustration of the structure of FIG. 9 after the nitride layer is etched away to form spacers in accordance with the present invention.

After the formation of the gate 78, an oxide liner 80 having a thickness of about 100 Å is deposited over the structure, as illustrated in FIG. 8. A nitride layer 82 having a thickness of about 700–1000 Å is then deposited over the oxide liner 80, as illustrated in FIG. 9. Nitride spacers 86 are formed along sidewalls of the gate 78. The nitride layer 82 is anisotropically etched to form the spacers 86 on the sidewalls of the gate 78, for example. An etchant which selectively etches the spacer material layer (e.g., etches the spacer material layer at a faster rate than the top silicon layer 70), may be used to etch the spacer material layer until only the spacers 86 remain at the sidewalls of the gate 78 as shown in FIG. 10.

Figure 11:
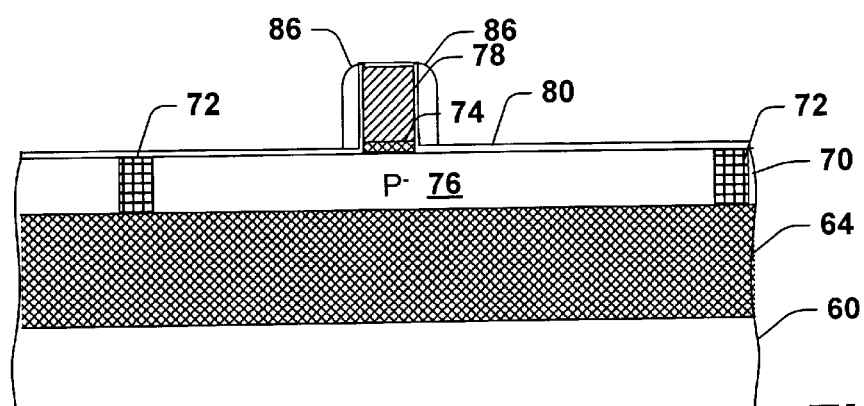
FIG. 11 is a schematic cross-sectional illustration of the structure of FIG. 10 undergoing an ion implant step to form N⁺ source/drain (S/D) regions in accordance with the present invention.
Figure 12:
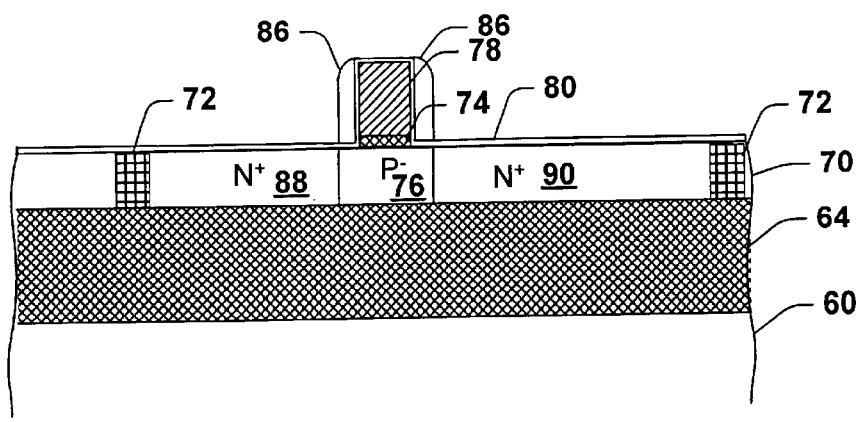
FIG. 12 is a schematic cross-sectional illustration of the structure of FIG. 11 after the ion implant step to form N⁺ source/drain (S/D) regions in accordance with the present invention.
Figure 19:
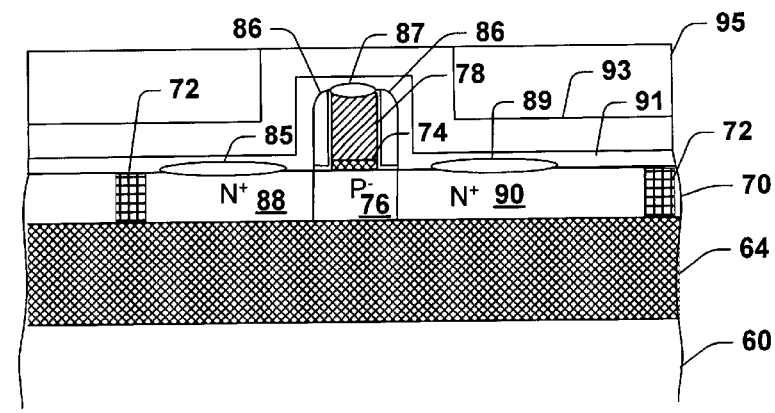
FIG. 19 is a schematic cross-sectional illustration of the structure of FIG. 18 after a polishing step has been performed on the TEOS layer in accordance with the present invention.

After the formation of the spacers 86, another ion implant step 120 is performed as shown in FIG. 11. An N$^+$ implant is performed in step 120 to form N$^+$ source region 88 and N$^+$ drain region 90. The spacers 86 serve as masks to prevent ion implantation in the regions of the P-body region 76 underlying the spacers 86. FIG. 11 shows the formation of the N+ source region 88 and N+ drain region 90 by masking a region of the top silicon layer 70 with a source drain channel mask 35 and implanting N+ dopants 120 (FIG. 11) to provide the N+ source region 88 and N+ drain region 90 (FIG. 12). The source drain channel mask 35 allows N+ dopants to dope the RTD region 16 (FIG. 19). In a preferred aspect of the invention, this implant step 120 maybe an arsenic implant having a dose of $3\times10^{15}$ to $4\times10^{15}$ atoms/cm$^2$ and an energy range of about 25 KeV to about 30 KeV. A rapid temperature anneal (RTA) can be performed to active the source region 88 and the drain region 90.

Figure 13:
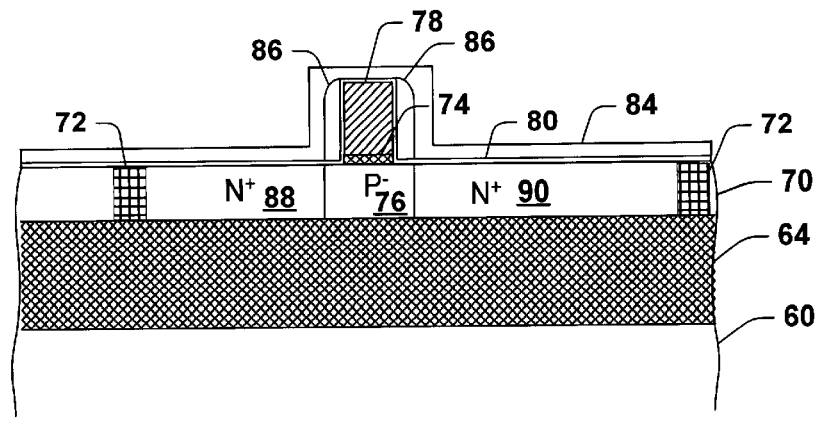
FIG. 13 is a schematic cross-sectional illustration of the structure of FIG. 12 after an oxide layer is deposited over the structure in accordance with the present invention.
Figure 14:
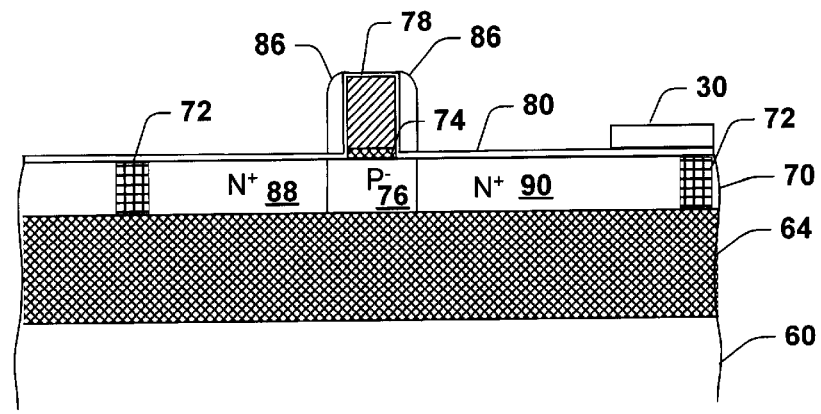
FIG. 14 is a schematic cross-sectional illustration of the structure of FIG. 13 after the oxide layer is etched away to form a resistor protection mask over the RTD region in accordance with the present invention.
Figure 15:
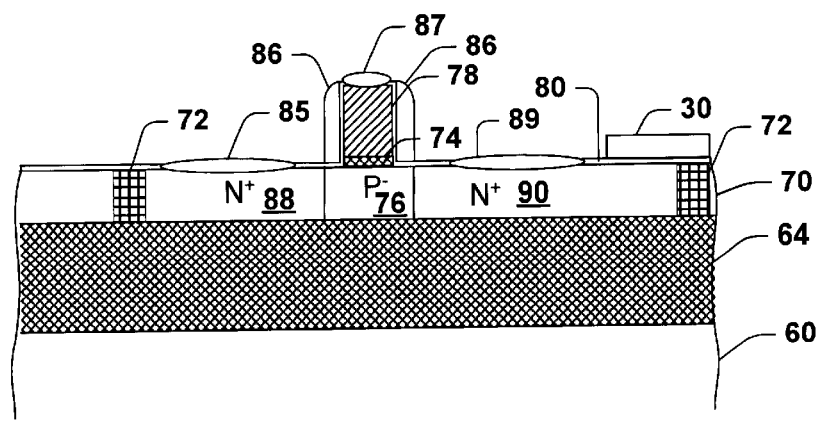
FIG. 15 is a schematic cross-sectional illustration of the structure of FIG. 14 after silicide is deposited over the gate and the N⁺ source/drain (S/D) regions in accordance with the present invention.

An insulating layer 84 having a thickness of 100–200 Å is formed by depositing tetraethoxysilane (TEOS) oxide, silicon dioxide or the like over the surface of the top silicon layer 70, as illustrated in FIG. 13. The insulating layer is anisotropically etched away from the transistor region, but left over the RTD region to form the resistor protection mask 30 as illustrated in FIG. 14. The resistor protection mask 30 protects the RTD region from silicide during a silicide deposit step. Turning now to FIG. 15, a source silicide film 85 and a drain silicide film 89 are formed over source 88 and drain 90, respectively. A gate silicide film 87 is formed over the gate 78. Preferably, the silicide is cobalt silicide.

Figure 16:
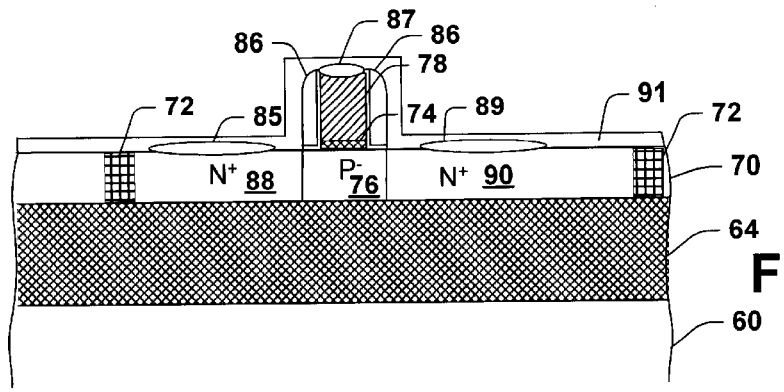
FIG. 16 is a schematic cross-sectional illustration of the structure of FIG. 15 after an insulating layer is deposited over the structure in accordance with the present invention.
Figure 17:
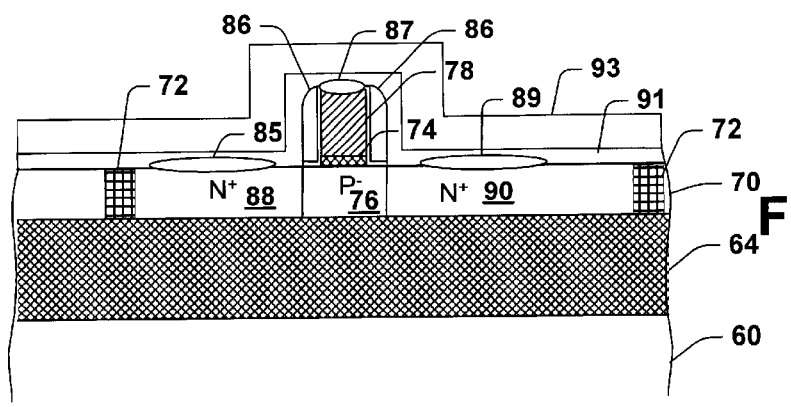
FIG. 17 is a schematic cross-sectional illustration of the structure of FIG. 16 after a nitride layer is deposited over the insulating layer in accordance with the present invention.
Figure 18:
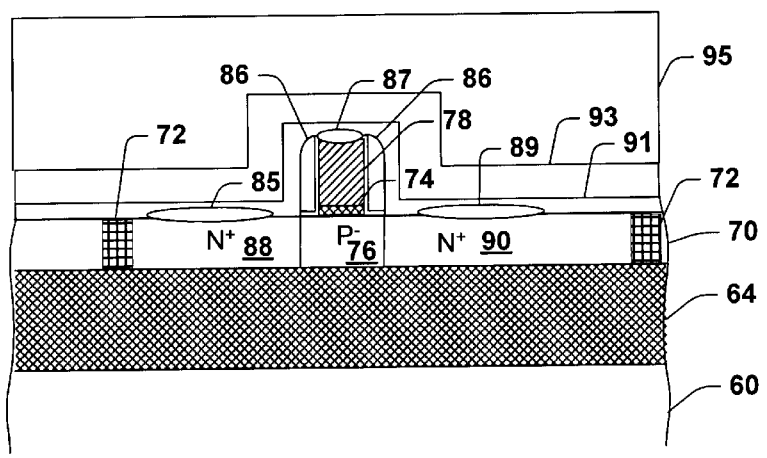
FIG. 18 is a schematic cross-sectional illustration of the structure of FIG. 17 after a TEOS layer is deposited over the nitride layer in accordance with the present invention.

Next another insulating layer 91 having a thickness of about 200 Å is formed by depositing tetraethoxysilane (TEOS) oxide, silicon dioxide or the like over the surface of the top silicon layer 70, as illustrated in FIG. 16. A silicon nitride layer 93 having a thickness of about 200–500 Å is deposited over the insulating layer 91 illustrated in FIG. 17. Next a TEOS layer 95 having is formed over the surface of the silicon nitride layer 93, as illustrated in FIG. 18. The TEOS layer 95 is then polished down to the nitride layer 93 as illustrated in FIG. 19.

Figure 20:
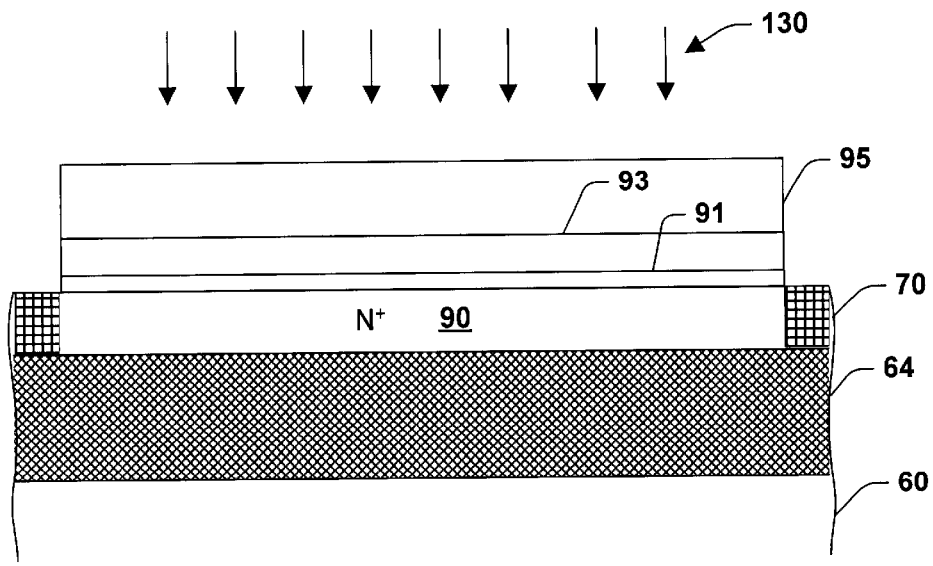
FIG. 20 is a schematic cross-sectional illustration of the structure of FIG. 19 illustrating the RTD structure along the lines Y—Y undergoing an etching step to form openings in the RTD structure in accordance with the present invention.
Figure 21:
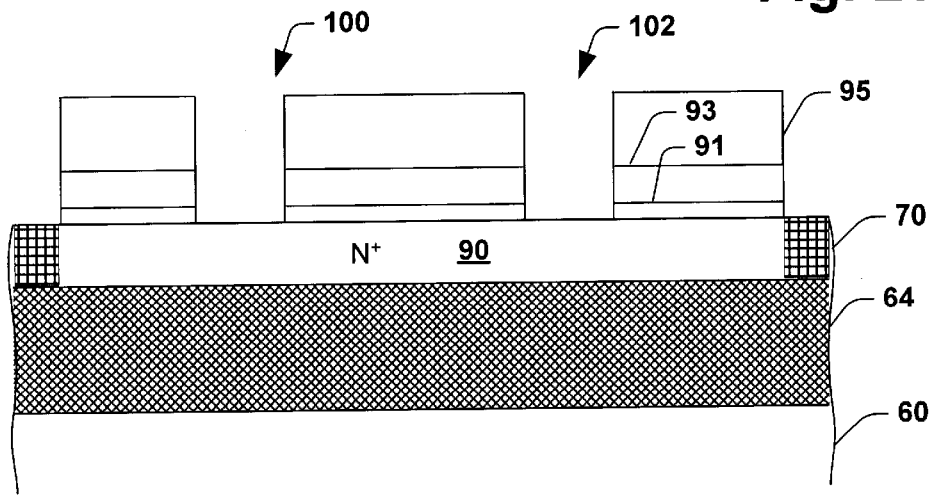
FIG. 21 is a schematic cross-sectional illustration of the structure of FIG. 20 after the etching step to form openings in the RTD structure in accordance with the present invention.

Turning now to FIGS. 20–25, fabrication steps in connection with forming the RTD structure in the RTD region 16 of FIG. 1a is discussed. Turning now to FIG. 20, a Y—Y cross section through a central region of the RTD area is illustrated. An etch step 130 (e.g., anisotropic reactive ion etching (RIE)) (FIG. 21) is performed to form a first opening 100 and a second opening 102 (FIG. 20) in the RTD region employing the P+ RTD mask 40. Any suitable etch technique may be used to etch the first and second openings in the device. For example, the device can be anisotropically etched with a plasma gas(es), herein carbon tetrafloride (CF$_4$) containing fluorine ions, in a commercially available etcher, such as a parallel plate RIE apparatus or, alternatively, an electron cyclotron resonance (ECR) plasma reactor to replicate a mask pattern of a patterned photoresist layer (not shown).

Figure 22:
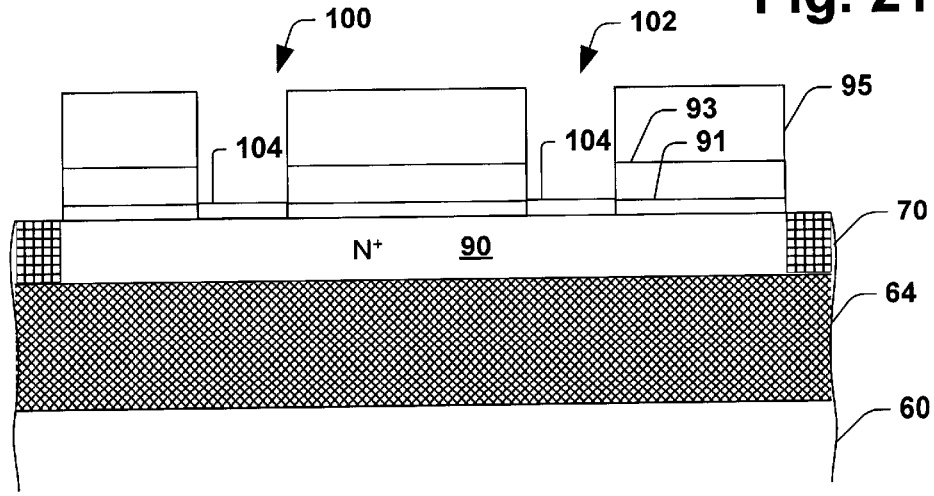
FIG. 22 is a schematic cross-sectional illustration of the structure of FIG. 21 after undoped silicon is deposited in the openings in accordance with the present invention.
Figure 23:
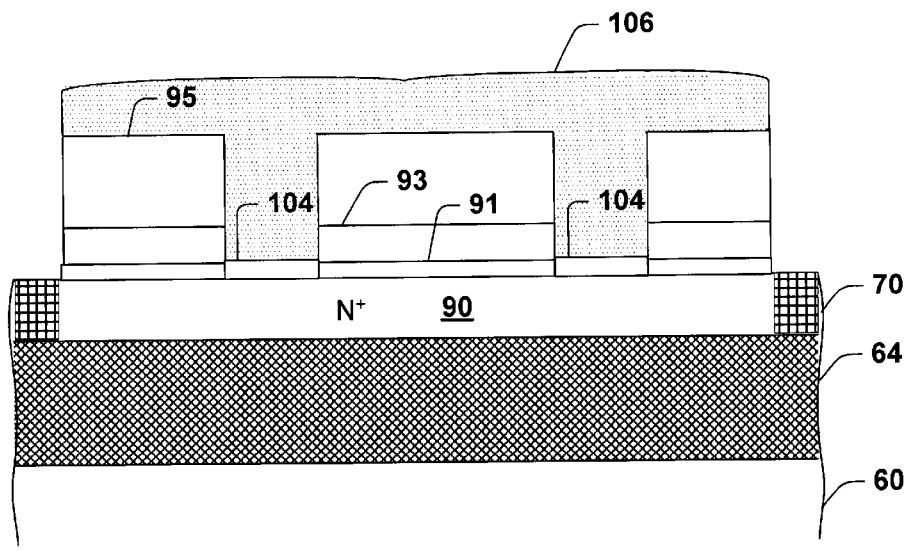
FIG. 23 is a schematic cross-sectional illustration of the structure of FIG. 22 after a P+ amorphous layer is deposited over the structure in accordance with the present invention.

FIG. 22 illustrates a deposition step for depositing undoped silicon or undoped silicon germanium layers 104 in the first opening 100 and the second opening 102. The undoped layers 104 form the tunneling barriers of the resonant tunneling diodes. FIG. 23 illustrates another deposition step for depositing in-situ amorphous silicon layer 106 (P+ doped with boron). Preferably, the amorphous silicon layer 106 has a boron concentration of about $1\times10^{20}$ atoms/cm$^3$. Optionally, a rapid temperature anneal (RTA) is performed for 10–20 seconds at a temperature of 600–700° C. on the P+ amorphous silicon layer 106.

Figure 24:
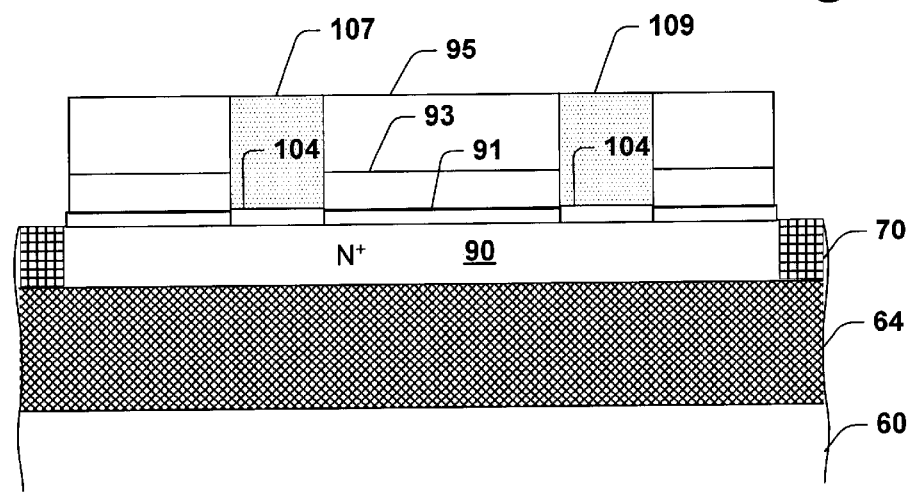
FIG. 24 is a schematic cross-sectional illustration of the structure of FIG. 23 after the P+ amorphous layer is polished back to form a first and a second contacting region in accordance with the present invention.
Figure 25:
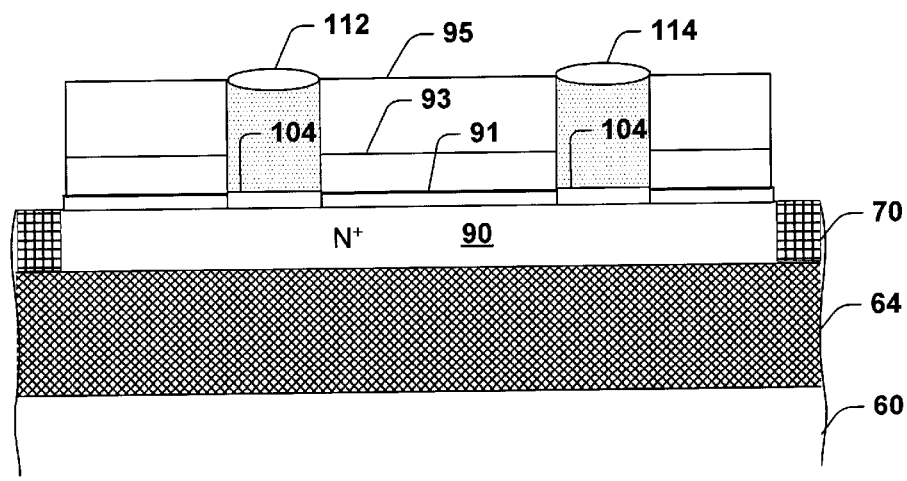
FIG. 25 is a schematic cross-sectional illustration of the structure of FIG. 24 after silicide is deposited over the first and the second contacting regions in accordance with the present invention.

FIG. 24 illustrates the RTD structure after a polished back step has been performed to remove a predetermined thickness of the amorphorous silicon layer 106. Preferably, the polished back step is performed to remove an amount of the amorphourous silicon, equivalent to the thickness amorphorous silicon layer 106 overlying the nitride layer 93. Substantial completion of the polished back step results in a RTD structure having a first contacting area 107 and a second contacting area 109. FIG. 25 illustrates a depositing step for depositing a silicide film 112 over the first contacting area 107 and a second silicide film 114 over the second contacting area 109. Preferably, the silicide film 112 and the silicide film 114 are nickel silicide. FIG. 25 illustrates the completed RTD structure in relevant part.

Figure 26:
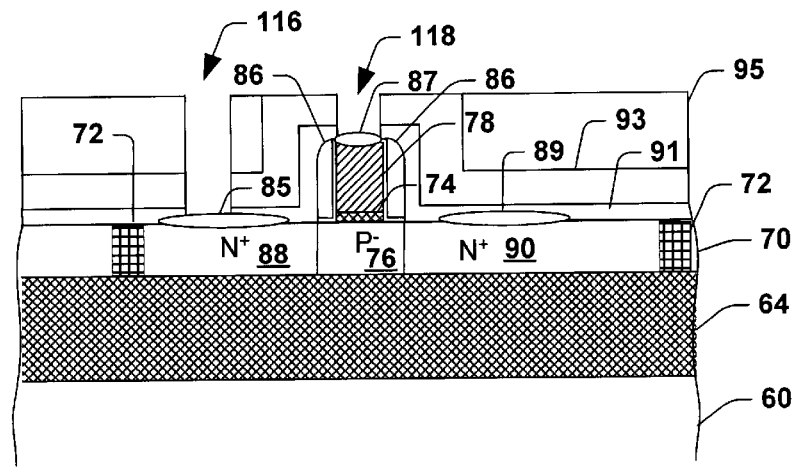
FIG. 26 is a schematic cross-sectional illustration of the structure of FIG. 19 after undergoing and etching step to form openings in the transistor region in accordance with the present invention.

FIG. 26 illustrates the state of the transistor structure after trenches are formed for connecting the transistor structure to a word line and a bit line. An etch step (e.g., anisotropic reactive ion etching (RIE)) is performed to form a first trench 116 and a second trench 118 in the isolation layer 91. A patterned photoresist (not shown) may be used as a mask for selectively etching the layers 91, 93 and 95. Any suitable etch technique may be used to etch the layers 91, 93 and 95. For example, the layers 91, 93 and 95 can be anisotropically etched with a plasma gas(es), herein carbon tetrafloride (CF$_4$) containing fluorine ions, in a commercially available etcher, such as a parallel plate RIE apparatus or, alternatively, an electron cyclotron resonance (ECR) plasma reactor to replicate the mask pattern of the patterned photoresist layer to thereby create the first trench 116 and the second trench 118 in the layers 91, 93 and 95.

Figure 27:
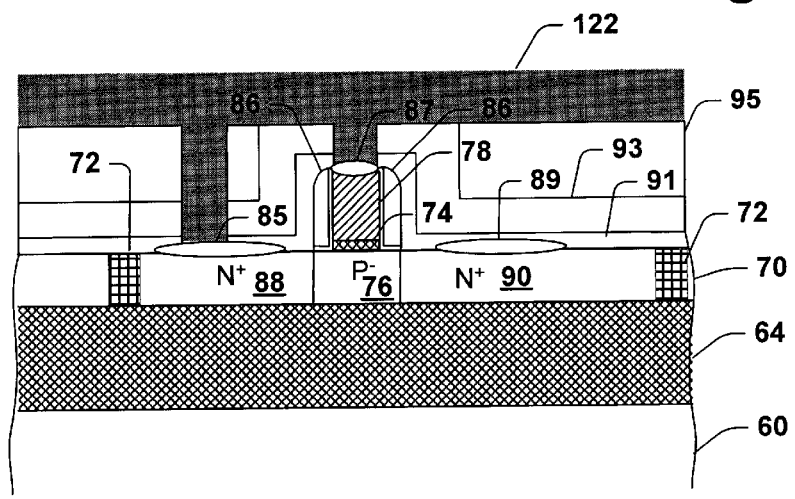
FIG. 27 is a schematic cross-sectional illustration of the structure of FIG. 26 after a metal layer is deposited over the structure in accordance with the present invention.
Figure 28:
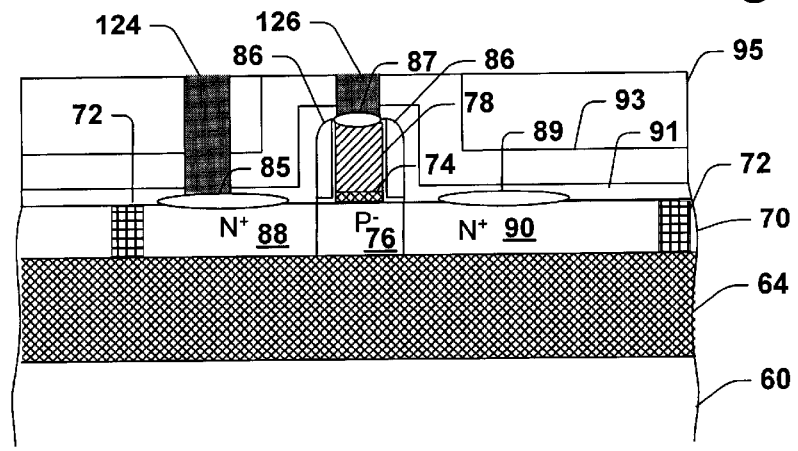
FIG. 28 is a schematic cross-sectional illustration of the structure of FIG. 27 after the metal layer has been polished back in accordance with the present invention.

Thereafter, as illustrated in FIG. 27, the first and second trenches are filled with a metal 122 (e.g., aluminum, aluminum alloy, copper, copper alloy, tungsten, tungsten alloy) so as to form a first conductive line and a second conductive line. FIG. 28 illustrates the transistor structure after a polished back step has been performed to remove a predetermined thickness of the metal layer 122. Preferably, the polished back step is performed to remove an amount of the metal, equivalent to the thickness of the metal layer 122 overlying the insolation layer 91. Substantial completion of the polished back step results in a transistor structure in relevant part as illustrated in FIG. 28. The transistor structure includes a conducting line 124 for connecting the source of the transistor structure to a bit line and a second conducting line 126 for connecting the gate of the transistor structure to a word line.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of forming a memory device, comprising the steps of:

forming a silicon base, an oxide layer over the base and a top thin silicon layer over the oxide layer, the top silicon layer having a first region and a second region;

masking the second region of the top thin silicon layer and forming a transistor device in the first region of the top silicon layer; and masking the first region of the top thin silicon layer and forming a vertical RTD device in the second region wherein the step of forming a vertical RTD device in the second region comprises implanting a n+ dopant to form concurrently a source and drain region of the transistor device and a generally horizontal N+ quantum well region of the vertical RTD device, the drain region of the transistor device being coupled to the quantum well region of the vertical RTD, the N$^+$ quantum well region being disposed horizontally below a top surface of the second region.

2. The method of claim 1, further comprising forming a first opening above the N$^+$ quantum well region on a first end of the N$^+$ quantum well region and forming a second opening above the N$^+$ quantum well region on a second end of the N$^+$ quantum well region.

3. The method of claim 2, further comprising depositing a first thin layer of undoped silicon in the first opening to form a first tunneling barrier and depositing a second thin layer of undoped silicon in the second opening to form a second tunneling barrier.

4. The method of claim 3, further comprising depositing a layer of in-situ P$^+$ amorphous silicon layer over the first and second regions and polishing the RTD structure to remove a predetermined thickness of the amorphous silicon to form a first contact region over the layer of undoped silicon in the first opening and a second contact region over the layer of undoped silicon in the second opening.

5. The method of claim 4, the amorphous silicon having a boron concentration of about $1 \times 10^{20}$ atoms/cm$^3$.

6. The method of claim 2, further comprising depositing a first thin layer of undoped germanium in the first opening to form a first tunneling barrier and depositing a second thin layer of undoped germanium in the second opening to form a second tunneling barrier.

7. The method of claim 6, further comprising depositing a layer of in-situ P+ amorphous silicon layer over the first and second regions and polishing the RTD structure to remove a predetermined thickness of the amorphous silicon.

8. The method of claim 7, the amorphorous silicon having a boron concentration of about $1 \times 10^{20}$ atoms/cm$^3$.

9. The method of claim 1, the top silicon layer having a thickness between 800–1200 Å.

10. The method of claim 1, the oxide layer having a thickness around 2000 Å.

11. The method of claim 1, the step of forming a transistor comprising forming a gate, implanting p$^-$ dopants in the first region to provide a p-type body, forming a first pair of spacers adjacent the gate prior to the step of implanting n$^+$ dopant to form source and drain regions of the transistor device and the silicon quantum well.

12. The method of claim 11, the step of forming the gate comprising laying a thin gate oxide material having a thickness in the range of 10–20 Å over the first region, depositing a polysilicon layer having a thickness of about 80–120 nm over the thin gate oxide material and etching a gate using a gate mask.

13. The method of claim 12, the step of implanting p$^-$ dopants in the first region to provide a p-type body comprising using boron having a dose of about $1 \times 10^{13}$ to $2 \times 10^{13}$ atoms/cm$^2$ and an energy range of about 3 KeV to about 5 KeV.

14. The method of claim 13, the step implanting n$^+$ dopant to form source and drain regions of the transistor device and a silicon quantum well in the comprising using arsenic having a dose of about $3 \times 10^{15}$ to $4 \times 10^{15}$ atoms/cm$^2$ and an energy range of about 25 KeV to about 30 KeV.

15. The method of claim 14, the step of forming a pair of spacers adjacent the gate comprising depositing a nitride layer over both the first and second regions of the top silicon layer and etching the nitride layer to form the pair of spacers.

16. A method of forming a memory device, comprising the steps of:

forming a silicon base, an oxide layer over the base and a top thin silicon layer over the oxide layer, the top silicon layer having a first region and a second region;

masking the second region of the top silicon layer and forming a gate and a P$^+$ body region;

forming a nitride layer over the top silicon layer;

forming a spacer pair adjacent opposite sides of the gate;

forming N$^+$ source and N$^+$ drain regions in the first region and a N$^+$ quantum well region in the second region of the top silicon layer, the drain region of the transistor device being coupled to the quantum well region of the vertical RTD, the N$^+$ quantum well region being disposed horizontally below a top surface of the second region;

depositing a first insulating layer over the top surface of the silicon layer;

removing the first insulating layer from the first region forming a resistor protection mask over the second region;

depositing a first silicide over the gate and the N$^+$ source and N$^+$ drain regions;

depositing a second insulating layer over the top surface of the silicon layer;

depositing a nitride layer over the second insulating layer;

forming a first opening above the N$^+$ quantum well region on a first end of the N+ quantum well region and forming a second opening above the N$^+$ quantum well region on a second end of the N$^+$ quantum well region;

depositing a first thin layer of undoped silicon in the first opening to form a first tunneling barrier and depositing a second thin layer of undoped silicon in the second opening to form a second tunneling barrier;

depositing an in-situ P$^+$ amorphous layer over the first and second regions and polishing the RTD structure to remove a predetermined thickness of the amorphous layer equivalent to the thickness of the amorphous layer overlying the nitride layer to form a first contact region over the layer of undoped silicon in the first opening and a second contact region over the layer of undoped silicon in the second opening; and depositing a second silicide over the first contact region and the second contact region.

17. The method of claim 16, the nitride layer having a thickness of about 700–1000 Å.

18. The method of claim 16, the first silicide being cobalt silicide.

19. The method of claim 16, the second silicide being nickel silicide.

20. The method of claim 16, the in-situ P$^+$ amorphous layer being silicon.

21. The method of claim 16, the in-situ P$^+$ amorphous layer being germanium.

22. The method of claim 16, the amorphous layer having a boron concentration of about $1 \times 10^{20}$ atoms/cm$^3$.

23. The method of claim 16, the step of implanting p$^-$ dopants in the first region to provide a p-type body comprising using boron having a dose of about $1 \times 10^{13}$ to $2 \times 10^{13}$ atoms/cm$^2$ and an energy range of about 3 KeV to about 5 KeV.

24. The method of claim 16, the step implanting n$^+$ dopant to form source and drain regions of the transistor device and a silicon quantum well in the comprising using arsenic having a dose of about $3 \times 10^{15}$ to $4 \times 10^{15}$ atoms/cm$^2$ and an energy range of about 25 KeV to about 30 KeV.

* * * * *